United States Patent
Bouvier et al.

(10) Patent No.: US 12,520,595 B2
(45) Date of Patent: Jan. 6, 2026

(54) ELECTRONIC DEVICE WITH DIFFERENTIAL TRANSMISSION LINES EQUIPPED WITH CAPACITORS SEPARATED BY A CAVITY, AND CORRESPONDING MANUFACTURING METHOD

(71) Applicant: Murata Manufacturing Co., Ltd., Nagaokakyo (JP)

(72) Inventors: Stéphane Bouvier, Cairon (FR); David Denis, Bayeux (FR); Emmanuel Lefeuvre, Caen (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 593 days.

(21) Appl. No.: 17/946,455

(22) Filed: Sep. 16, 2022

(65) Prior Publication Data
US 2023/0012912 A1    Jan. 19, 2023

Related U.S. Application Data

(63) Continuation of application No. PCT/IB2021/052283, filed on Mar. 18, 2021.

(30) Foreign Application Priority Data

Mar. 19, 2020 (EP) .................................... 20305286

(51) Int. Cl.
*H10D 86/85* (2025.01)
*H01L 21/762* (2006.01)
(Continued)

(52) U.S. Cl.
CPC ....... *H10D 86/85* (2025.01); *H01L 21/76224* (2013.01); *H01L 23/642* (2013.01);
(Continued)

(58) Field of Classification Search
CPC .. H10D 86/85; H10D 1/716; H01L 21/76224; H01L 23/642; H01L 27/013;
(Continued)

(56) References Cited

U.S. PATENT DOCUMENTS 7,545,022 B2 * 6/2009 Chen ................... H01L 23/5223
                                                  257/532
8,373,967 B2   2/2013 Goetz
(Continued)

OTHER PUBLICATIONS

International Search Report issued for PCT/IB2021/052283, date of mailing Jun. 23, 2021.

*Primary Examiner* — William B Partridge
*Assistant Examiner* — David Paul Sedorook
(74) *Attorney, Agent, or Firm* — ArentFox Schiff LLP

(57) ABSTRACT

An electronic device is provided that includes a board equipped with a pair of differential transmission lines that each have an opening extending between two line terminals. Moreover, the device includes a capacitor module that includes a support and two capacitors that each have two capacitor terminals, respectively, connected to the two line terminals of one line of the pair of transmission lines. In addition, the support includes a separating region between the two capacitors that has at least one cavity disposed between the two capacitors.

18 Claims, 7 Drawing Sheets

(51) Int. Cl.
*H01L 23/64* (2006.01)
*H05K 1/02* (2006.01)
*H05K 1/18* (2006.01)

(52) U.S. Cl.
CPC ........... *H05K 1/0245* (2013.01); *H05K 1/181* (2013.01); *H05K 2201/10015* (2013.01)

(58) Field of Classification Search
CPC ................ H05K 1/0245; H05K 1/181; H05K 2201/10015; H05K 1/0231; H01P 1/2007; H01P 3/026; H01G 2/06; H01G 4/38
See application file for complete search history.

(56) References Cited

U.S. PATENT DOCUMENTS

| | | | |
|---|---|---|---|
| 9,185,794 B1 | 11/2015 | Reynov et al. | |
| 10,470,296 B2 | 11/2019 | Miyasaka | |
| 10,475,786 B1 | 11/2019 | Tang et al. | |
| 2012/0188742 A1* | 7/2012 | Gilliland | H01G 2/065 |
| | | | 361/811 |
| 2016/0276306 A1* | 9/2016 | Kamphuis | H01L 23/544 |
| 2018/0254252 A1* | 9/2018 | Nakagawa | H01L 23/50 |
| 2018/0366396 A1* | 12/2018 | Komatsu | H01L 24/97 |
| 2019/0246495 A1 | 8/2019 | Kawazu | |
| 2019/0363080 A1 | 11/2019 | Tang et al. | |

\* cited by examiner ns lines of a
ELECTRONIC DEVICE WITH DIFFERENTIAL TRANSMISSION LINES EQUIPPED WITH CAPACITORS SEPARATED BY A CAVITY, AND CORRESPONDING MANUFACTURING METHOD

CROSS REFERENCE TO RELATED APPLICATIONS

This application is a continuation of PCT Application No. PCT/IB2021/052283, filed Mar. 18, 2021, which claims priority to European Patent Application No. 20305286.5, filed Mar. 19, 2020, the entire contents of each of which are hereby incorporated by reference in their entirety.

FIELD OF THE INVENTION

The present invention relates to the field of integration and, more particularly, to electronic devices in which differential signals are used.

BACKGROUND

Currently, many electronic devices use pairs of wires or lines to transmit complementary signals, in a technique known to the person skilled in the art as differential signaling. Each wire of these pairs of wires conveys a signal which is complementary with the signal received on the other wire.

Such a pair of wires or lines is often called a differential pair, or a pair of differential transmission lines, or a pair of differential transmission wires.

In many devices, it is necessary to provide DC isolation or DC blocking between active circuits connected together and which may use different DC supply voltages.

Typically, discrete capacitors are connected in series between two portions of the wires of the differential pair, one for each differential channel. Multi-layer ceramic capacitors (MLCC) capacitors are generally used in current circuits.

Because of the need for smaller devices, smaller MLCC capacitors are now used. However MLCC capacitors present several drawbacks which will appear more clearly in view of FIGS. 1A and 1B.

FIG. 1A is a schematic perspective view of an example of a device according to the prior art. This device comprises a board 100 which may be a PCB. On this PCB 100, several pairs 101 of differential lines have been printed. Each pair 101 comprises two lines 102 which extend on the surface of the board 100. Each line 102 is equipped with a capacitor 103 connected in series in the middle of the line 102.

It has been observed that while MLCC capacitors can be made in small dimensions, the soldering pads 104 that are used to connect the capacitors to the lines 102 limit the number of capacitors that can be connected adjacently in a region of the board such as the board 100. Also, the various rules (such as keepouts, etc.) associated with the manufacturing processes to be used when using MLCC capacitors limit this number of capacitors that can be connected adjacently.

This results from design rules that usually require a critical distance to be respected between adjacent soldering pads such as the soldering pads 104.

Also, on a circuit having several pairs of differential lines, it is usually required that the lines all have the same characteristic impedance, and this usually results in devices where the capacitors are preferably aligned and where there is a gap having a constant gap width between the lines of a pair.

In a pair of differential lines, the lines also have preferably the same geometrical and electrical length. This results in a large surface area being used, as shown on the figure, where the capacitors are spread in a direction which is substantially orthogonal with the general direction of the signal which may circulate in the lines.

Also, for a given pair of lines according to a device of the prior art, the gap between two lines cannot remain constant because of the constraints of the manufacturing processes that are used.

Because of the thickness of the capacitors 103, it has been observed that parasitic capacitors can appear between the capacitors 103 arranged as seen on the figure. This phenomenon, called parasitic coupling, has an impact on the differential characteristic impedance of a pair.

While spreading apart two adjacent capacitors reduces the parasitic coupling, it may increase the insertion losses and delay mismatch between pairs.

The solutions according to the prior art require that tradeoffs be made between the parasitic coupling, and the space occupied. Thus, tuning the characteristic impedance around the capacitors can be particularly complex.

FIG. 1B is a top view of the device of FIG. 1A. It is therefore desirable to obtain devices which show limited parasitic coupling between the capacitors while maintaining the characteristic impedance, and limited surface area occupancy. It is also desirable to obtain devices which facilitate tuning the characteristic impedance around the capacitors.

From the prior art, documents U.S. Pat. Nos. 8,373,967, 10,470,296, and 10,475,786 disclose known arrangements of capacitors on a pair of differential lines.

Moreover, U.S. Patent Pub. No. 2019/0363080 also discloses an arrangement in which differential lines do not remain parallel when capacitors have to be inserted.

The present invention has been made in light of the above problems discussed above with such convention designs.

SUMMARY OF THE INVENTION

In an exemplary aspect of the present invention, an electronic device is provided comprising a board equipped with a pair of differential transmission lines, each line of the pair having an opening extending between two line terminals; and a capacitor module comprising a support and two capacitors, each capacitor comprising two capacitor terminals respectively connected to the two line terminals of one line of the pair of transmission lines. Moreover, the support comprises a separating region between the two capacitors, the separating region comprising at least one cavity arranged between the two capacitors.

By using a support, here a single support, which will support the two capacitors, the two capacitors can be arranged closer to each other and more particularly closer to each other with respect to two discrete capacitors. Moreover, the use of a single support for two capacitors also facilitates manipulating and connecting the two capacitors, for example in a single step. In fact, there are fewer assembly steps required such as pick and place steps and positioning steps.

Because of its relative permittivity, the separating region placed between the two capacitors may increase the parasitic capacitance between the two capacitors (parasitic coupling) with respect to two identical capacitors without a support. This effect can be at least partially counterbalanced by the at least one cavity arranged in the separating region, which provides a possibility to lower the parasitic coupling between the two capacitors.

In an exemplary aspect, the two capacitors may be 2D capacitors such as planar silicon capacitors. In this case, the capacitors may be at least partially embedded in the support so that the separating region can separate the two capacitors by being placed between the sides of the two capacitors.

Moreover, in an exemplary aspect, the two capacitors may also be 3D capacitors formed in the support. For example, a 3D capacitor comprises functional electrodes presenting a relief (for example they comprise a surface presenting a relief or they are formed on a relief such as a pore, a hole, a trench, or a pillar). 3D capacitors may also be defined as comprising functional electrodes extending in three directions orthogonal with each other (for example two directions parallel to the support and one direction orthogonal with the support). In an exemplary aspect, a functional electrode is an electrode which faces the other electrode of the capacitor and participates to the capacitance of the device. Moreover, the capacitor terminals may be included in the functional electrodes, partially included in the functional electrodes, or may be connected to the functional electrodes. A functional electrode extending in the three directions is a functional electrode having an outer surface extending in these three directions.

According to a particular embodiment, the two capacitors extend into the support and the at least one cavity faces the two capacitors over the depth within which the two capacitors extend into the support. The depth is measured in a direction which is orthogonal with the plane in which the signal travels in the transmission lines.

If the two capacitors are within the support, for example, if they are flush with a face of the support, the cavity can extend from this face of the support so as to reach said depth in an exemplary aspect.

If the two capacitors are fully incorporated in the support, for example, buried in the support so as to reach a depth measured from a face, the cavity can extend from this face of the support so as to reach this depth measured from the face in an exemplary aspect.

According to a particular embodiment, the two capacitors are formed using at least one common manufacturing step. In an exemplary aspect, this common manufacturing step may be a material deposition step, an etching step, a photolithography step, or any manufacturing step which allows parallel fabrication of two features respectively belonging to the two capacitors.

By common manufacturing step, should be understood that a single step may allow forming a same feature in the two capacitors.

According to a particular embodiment, the at least one cavity is empty (i.e. not filled with any material) or, if the separating region comprises a plurality of cavities arranged between the two capacitors, all the cavities of the plurality of cavities are empty.

This embodiment is particularly advantageous as the electronic device can be used for many applications with a characteristic impedance which can be adjusted subsequently, for example using a filling of a given number of cavities, as will be described hereinafter.

According to a particular embodiment, the at least one cavity is filled with a given material.

This given material can be chosen according to its relative permittivity and according to the application. For example, if the characteristic impedance obtained for a capacitor module is not suitable for an application, it is possible to replace the void left in the cavity by the given material so as to adjust the characteristic impedance.

According to a particular embodiment, the separating region comprises at least another cavity which is not filled with the given material. This particular embodiment provides a precise modification of the characteristic impedance. In fact, a precisely selected value can be obtained using a large number of cavities and a selective filling with the given material.

This configuration allows using a same capacitor module for different applications which require different characteristic impedances.

According to a particular embodiment, the separating region comprises a plurality of cavities arranged so as to form a regular pattern.

This regular pattern can be, for example, a 2D pattern such as a grid pattern. Alternatively, a 1D pattern can be used wherein the cavities are regularly arranged along a line.

This configuration facilitates the adaptation of the characteristic impedance of the capacitor module.

According to a particular embodiment, the two capacitors present a first width at the level of the capacitor terminals and a second width substantially between the two capacitor terminals of a capacitor, the second width being smaller than the first width.

The width of a capacitor can be measured in a direction which is perpendicular with the direction in which the signal travels in the differential transmission lines. In addition, the width can be defined as the distance between two edges of functional electrodes of a capacitor, often called the intrinsic part of the capacitor, or the distance between two edges of a contact plate formed on a capacitor, often called the extrinsic part of the capacitor. The intrinsic part of the capacitor is the part of the capacitor obtained through the front-end phase of a manufacturing process used to make the capacitor, and the extrinsic part of the capacitor is the part of the capacitor obtained through the back-end phase of the manufacturing process used to make the capacitor. A reduction in any width (of the intrinsic or of the extrinsic) can affect the characteristic impedance of the capacitor module.

The two capacitor terminals respectively connected to the two line terminals of one line of the pair of transmission lines can be connected using conductive bumps.

It has been observed that these bumps may have dimensions that require larger capacitor terminals. However, it is possible to widen the separating region between the capacitor modules so as to maintain a lower parasitic capacitance between the capacitors and preserve the characteristic impedance.

According to a particular embodiment, the cavity is a trench, a hole, or an anodic pore. For example, the trench can be a trench surrounding one or more pillars. Alternatively, the trench may be straight, for example substantially parallel with the direction which the signals travel in the differential transmission lines.

Anodic pores can be formed by anodization of a suitable material. For example, Aluminum can be anodized to form pores having side walls comprising alumina.

According to a particular embodiment, the separating region comprises one or more substantially parallel trenches, for example all substantially parallel with the direction which the signals travel in the differential transmission lines.

These one or more substantially parallel trenches may be advantageously formed using a saw which can be used for wafer dicing.

Alternatively, trenches can be formed using etching methods such as Deep Reactive Ion Etching (DRIE). It should be noted that this method is also adapted to form holes.

According to a particular embodiment, the device comprises a plurality of pairs of said differential transmission lines, the capacitor module comprises, for each pair of differential transmission lines, two of said capacitors forming pairs of capacitors, and the support comprises additional separating regions between each pair of capacitor, at least one additional separating region comprising at least one cavity.

The above embodiments directed to cavities formed in separating regions also apply to the cavities formed in additional separating regions.

According to an exemplary embodiment, a method of manufacturing an electronic device is provided that comprises obtaining a board equipped with a pair of differential transmission lines, each line of the pair having an opening extending between two line terminals, obtaining a capacitor module comprising a support and two capacitors, each capacitor comprising two capacitor terminals respectively connected to the two line terminals of one line of the pair of transmission lines, wherein the two capacitors are separated by a separating region of the support, and forming at least one cavity in the separating region.

This method can include steps of manufacturing an electronic device according to any one of the above described embodiments.

According to a particular embodiment, the method further comprises filling the at least one cavity with a given material.

According to a particular embodiment, the method comprises forming at least another cavity and maintaining the at least another cavity unfilled with the given material.

According to a particular embodiment, forming at least one cavity comprises forming a trench, a hole, or an anodic pore.

According to a particular embodiment, the method comprises forming one or more trenches using a saw, the one or more trenches substantially parallel trenches, for example all substantially parallel with the direction which the signals travel in the differential transmission lines.

In an alternative exemplary embodiment, the trenches are formed using DRIE.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF THE EXEMPLARY EMBODIMENTS

Electronic devices of an exemplary embodiment and aspects of the invention will now be described in which capacitors embedded in capacitor modules will be mounted on pairs of differential lines arranged on a board and wherein cavities are formed between the capacitors of a capacitor module.

The electronic devices according to these exemplary embodiments can be used in any communication module which requires the use of differential lines (for example optical communication modules).

Figure 1A:
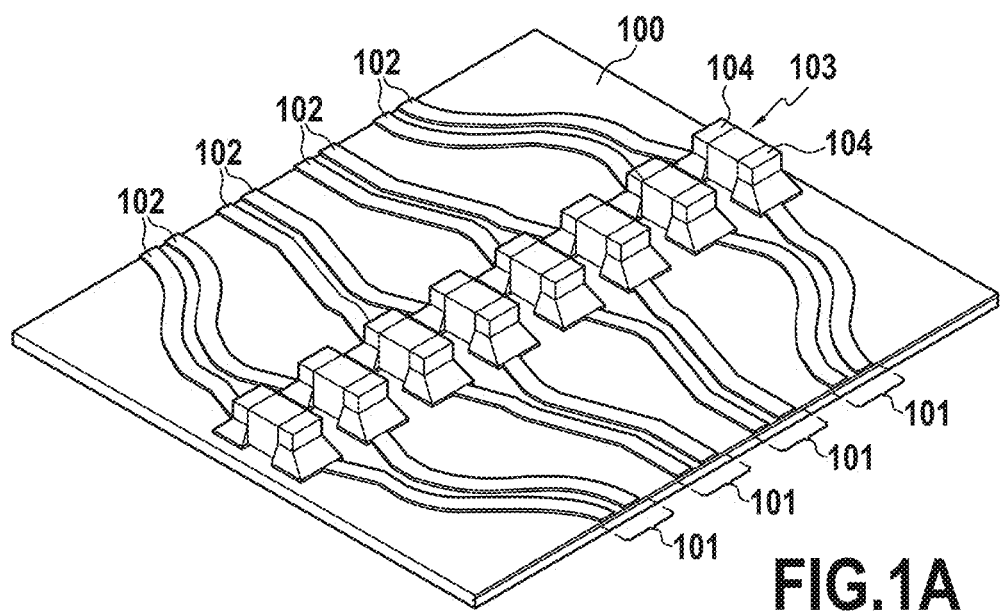
FIGS. 1A and 1B, already described, are example of devices according to the prior art.
Figure 1B:
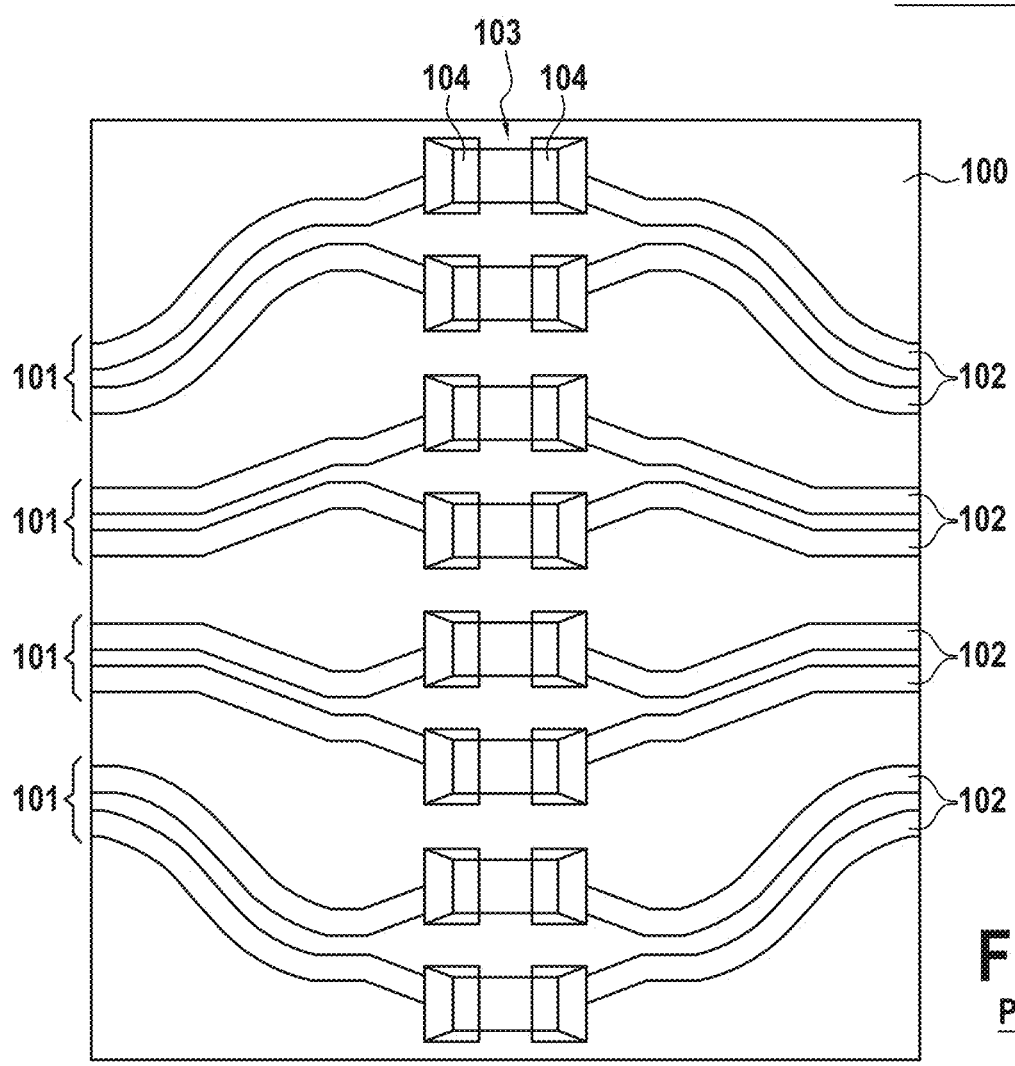
Figure 2A:
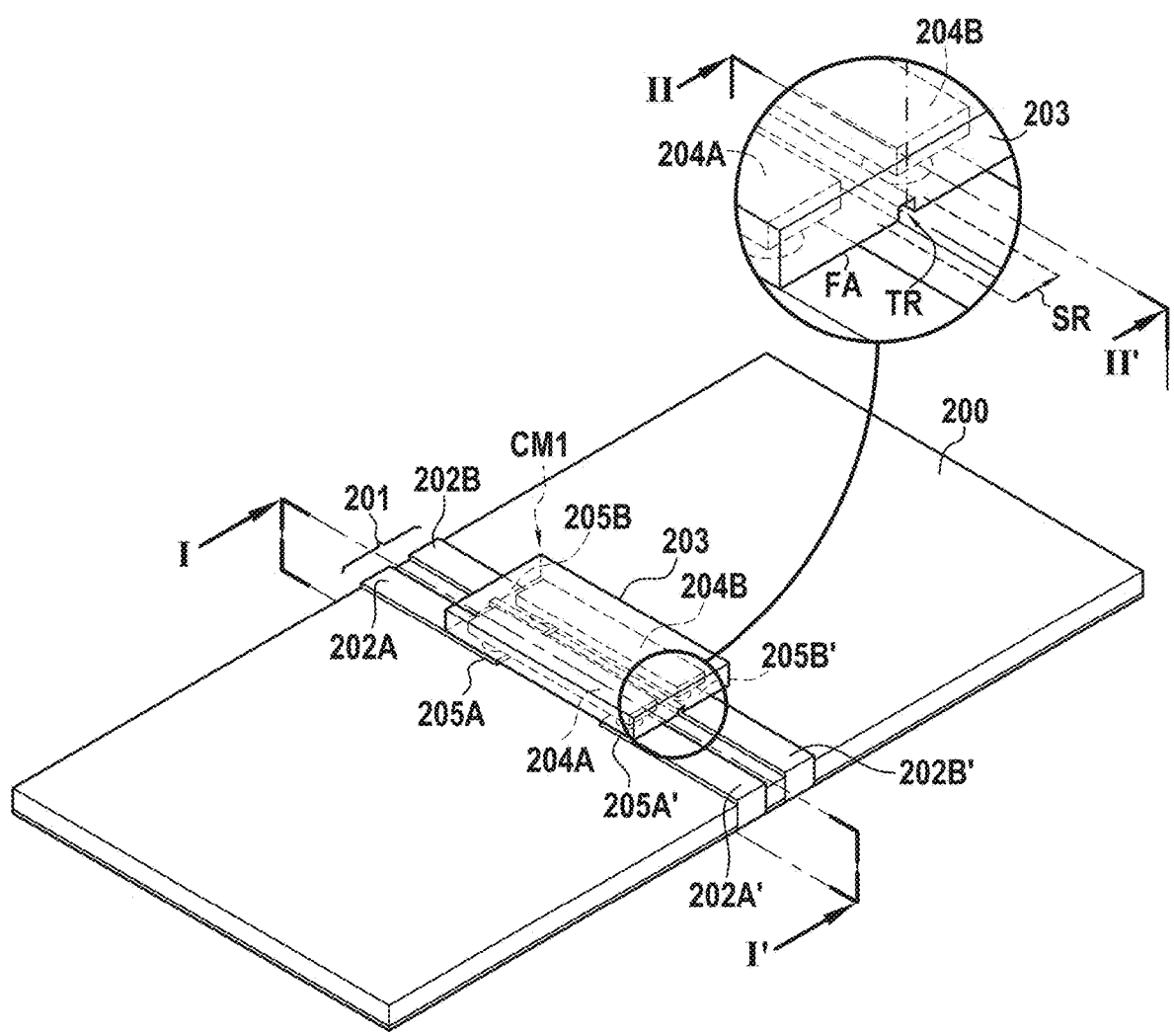
FIGS. 2A, 2B, and 2C are schematic representations of an electronic device according to an exemplary embodiment.

FIG. 2A is a perspective view of a device which includes a board 200 which is a PCB, typically comprising epoxy or ceramic.

On this board 200, a pair 201 of differential transmission lines has been printed (other alternatives are possible in which lines are etched/patterned). This pair of lines comprises four line segments shown on the visible portion of the device on the figure. These segments include segments 202A and 202A' of a first line, and segments 202B and 202B' of a second line. The two segments 202A and 202A' of the first line are separated by an opening which will be more visible on FIG. 2B described hereinafter. The two segments 202B and 202B' of the second line are separated by an opening which will be visible on FIG. 2B described hereinafter.

In order to block the DC component of the signal transmitted through the differential pair 201, a capacitor module CM1 is used.

The capacitor module CM1 comprises a support 203, and a first capacitor 204A and a second capacitor 204B.

As can be seen on the figure, the capacitors 204A and 204B are arranged so as to be as close as possible to the face of the board 200 which supports the pair of differential transmission lines 201. This allows maintaining the differential impedance as close as possible to the differential impedance of the lines. In this example, the capacitors 204A and 204B are flush with a face FA of the support 203 and extend in the support from this face until reaching a given depth.

The capacitors 204A and 204B are 3D capacitors and examples of 3D capacitors will be given hereinafter.

On this figure, line terminals 205A (at the end of segment 202A), 205A' (at the end of segment 202A'), 205B (at the end of segment 202B), 205B' (at the end of segment 202B') are also visible. These line terminals are separated by the above mentioned openings, and the capacitors 204A and 204B have capacitor terminals connected to these line terminals in a manner which will be described more precisely in reference to FIG. 2B.

The support 203 may comprise a semiconductor material such as silicon in an exemplary embodiment. Silicon has a relative permittivity of about 11.68 which implies that the parasitic coupling between capacitors 204A and 204B is increased with respect to two identical capacitors separated by air, and this affects the characteristic impedance of the capacitor module. The present disclosure provides a solution to modify the parasitic coupling between the two capacitors, by forming a cavity shaped, in the present example, in the shape of a trench TR. The trench TR is substantially parallel with the direction in which the signal will travel in the transmission lines, which is also the direction defined between two line terminals 205A and 205A', for example.

The trench TR is arranged in the separating region SR of the support which is between the two capacitors 204A and 204B, it is formed on face FA and has a depth which is the depth of the capacitors 204A and 204B. It should be noted that the trench TR may also have a depth with is greater than the depth of the capacitors 204A and 204B. The trench TR extends throughout the capacitor module CM1 from one edge to the opposite edge and is therefore always present in the region in which the two capacitors 204A and 204B face each other.

If the trench TR remains empty (with air having a relative permittivity of about 1), the parasitic coupling between the two capacitors will be lowered, and the characteristic impedance of the capacitor module will be different than without the trench TR.

Figure 2B:
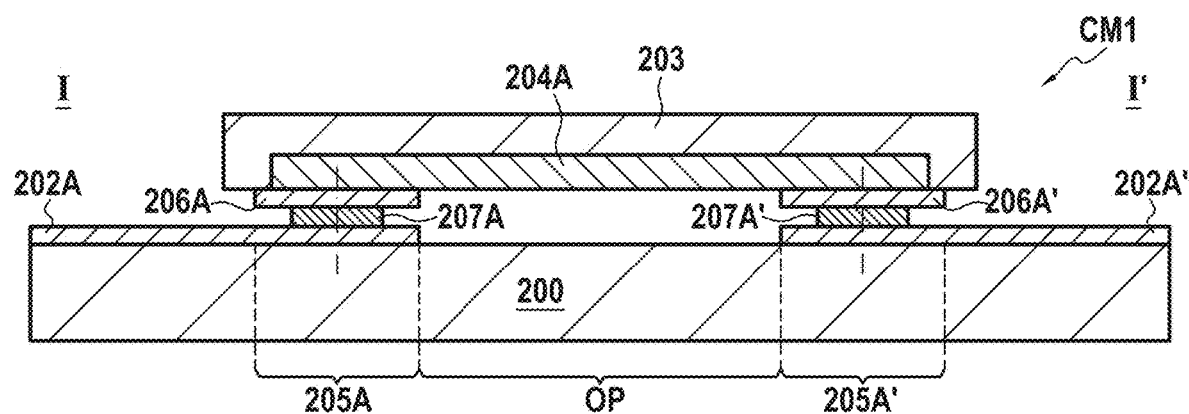

FIG. 2B is a cross section along the plane I-I' visible on FIG. 2A. This figure shows how capacitor 204A is arranged close to the board 200 as it extends from the face FA which faces the face of the board supporting the pair of differential lines 201.

As shown in this figure, the opening OP is visible between the line terminal 205A and the line terminal 205A'.

This figure also shows that the capacitor module CM1 comprises capacitor terminals 206A and 206A' which were not visible in the perspective view of FIG. 2A. Conductive bumps 207A and 207A' are also shown forming electrical contacts respectively between the capacitor terminal 206A and the line terminal 205A, and between the capacitor terminal 206A' and the line terminal 205A'. The flip chip method is used to assemble the capacitor module CM with the line terminals.

In the illustrated example, there is one conductive bump per capacitor electrode: there are four bumps for the capacitor module CM1. This facilitates placing the capacitor module CM1 and prevents any tilting from occurring when the device is placed. Consequently, a good differential characteristic impedance is obtained and the propagation of the signal is barely affected.

Also, in this example, the conductive bumps have substantially the same shape as the line terminals and the capacitor terminals.

Figure 2C:
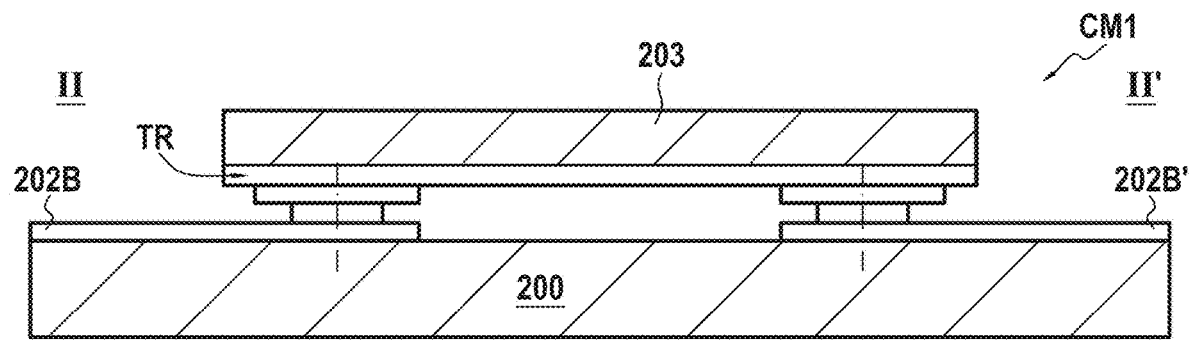

FIG. 2C is a cross section along the plane II-II' visible on FIG. 2A. This cross section shows how the trench TR extends throughout the capacitor module CM1.

It should be noted that the capacitor module of FIGS. 2A, 2B, and 2C presents a plane of symmetry which goes through the capacitor module CM between the two capacitors and through the trench TR.

Figure 3:
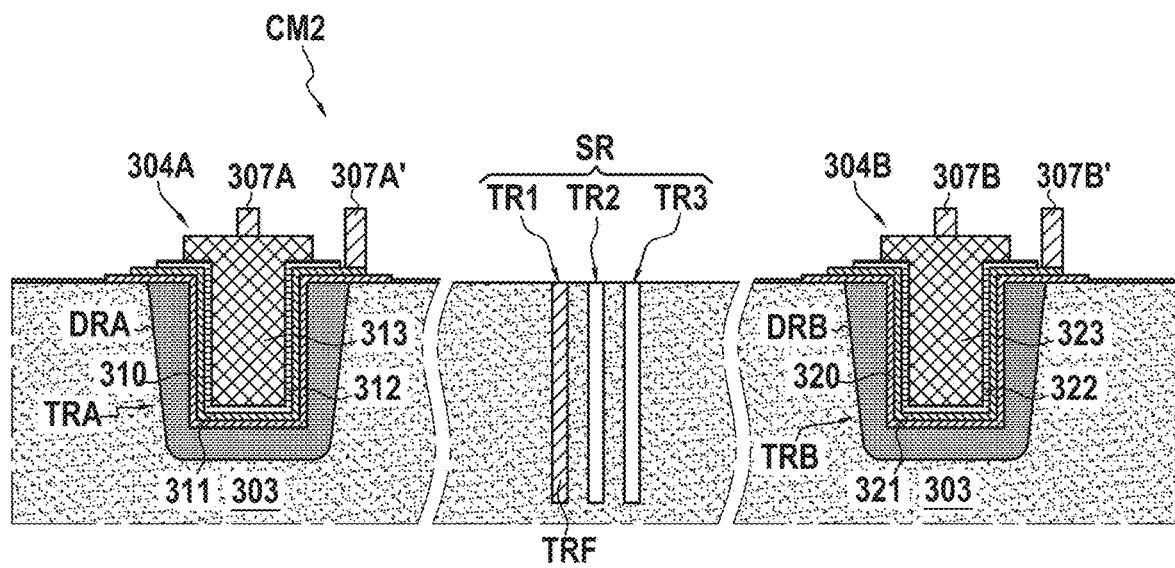
FIG. 3 is an example of a capacitor module wherein trenches are used.

FIG. 3 shows two 3D capacitors formed in a capacitor module CM2 which could be used as the capacitor module CM1 in the embodiment of FIGS. 2A to 2C.

The capacitor module CM2 comprises a support 303 which is a semiconductor substrate comprising, for example, silicon, gallium arsenide, aluminum nitride, or even gallium nitride.

Two trenches TRA and TRB have been formed in the support 303. The walls of these two trenches may be doped (represented with doped regions DRA and DRB on the figure) so as to be conductive and behave as a capacitor electrode and more precisely a functional capacitor electrode.

In order to form a first 3D capacitor 304A, the trench TRA is filled with a dielectric layer 310, a first conductive layer 311, a second dielectric layer 312, and a second conductive layer 313.

A second 3D capacitor 304 is formed by filling the trench TRB with a dielectric layer 320, a first conductive layer 321, a second dielectric layer 322, and a second conductive layer 323.

The person skilled in the art will understand that the structures obtained are a MIMIM structures: Metal-Insulator-Metal-Insulator-Metal structures, which allow parallelizing two capacitors to obtain a single capacitor with increased capacitance. It should be noted that all the capacitor modules described herein can be formed using MIM or MIMIM structures. Also, on the illustrated example, the interconnections between the electrodes of the capacitors are not fully represented for the sake of simplicity.

It should be noted that forming the two 3D capacitors 304A and 304B may be done using common manufacturing steps.

For example, forming the two trenches TRA and TRB may be done simultaneously in a single step, depositing the dielectric layers 310 and 320 may be done simultaneously in a single step, depositing the conductive layers 311 and 321 may be done simultaneously in a single step, depositing the dielectric layers 312 and 322 may be done simultaneously in a single step, and depositing the dielectric layers 313 and 323 may be done simultaneously in a single step.

It should be noted that this use of a common step ensures that the resulting features will have very similar properties in terms of dimensions and material, which will then turn to a good control of the differential characteristic impedance: the device is well balanced.

For accessing the electrodes of the capacitors, terminals 307A, 307A', 307B, and 307B' are respectively formed so as to obtain connections with layers 313, 311, 323, and 321. Although not shown on the figure, the doped regions DRA and DRB will be connected respectively with layers 313 and 323 to form parallel capacitors.

In the illustrated example, the trenches TRA and TRB may have a depth of less than 200 micrometers and a width of less than 10 micrometers.

However, it is noted that the exemplary embodiment of the present invention is not limited to trenches and also covers the use of holes, pillars, and the like.

It should be noted that in the illustrated example, the two 3D capacitors can be formed in a same silicon substrate which has a very low conductivity and may considered to be insulating by the person skilled in the art. The relative permittivity of silicon, having a value of 11.68, while acceptable for some applications, can lead to unacceptable parasitic coupling between the two capacitors for some applications.

Between the two capacitors, in the separating region SR, three trenches TR1, TR2, and TR3 are formed. These trenches can be parallel and aligned in the direction in which the signal will travel through the differential transmission lines.

A capacitor module equipped with the three trenches TR1, TR2, and TR3 can be used for different applications requiring either different values of parasitic coupling or different values of characteristic impedance. Depending on the requirements of the application, it is possible to fill any number of trenches so as to adapt the characteristic impedance. In the illustrated example of FIG. 3, trench TR1 is filled with silicon dioxide for forming a filling TRF. Silicon dioxide has a relative permittivity of about 3.9 which is greater than the relative permittivity of air and this will impact both the parasitic coupling and the characteristic impedance.

A single capacitor module can therefore be used for different applications.

Forming the trenches TR1, TR2, and TR3 can be simultaneous with forming the two trenches TRA and TRB, for example, this can be done in a same etching step. Alternatively, forming the trenches TR1, TR2, and TR3 can be performed using a saw for dicing substrates.

Figure 4:
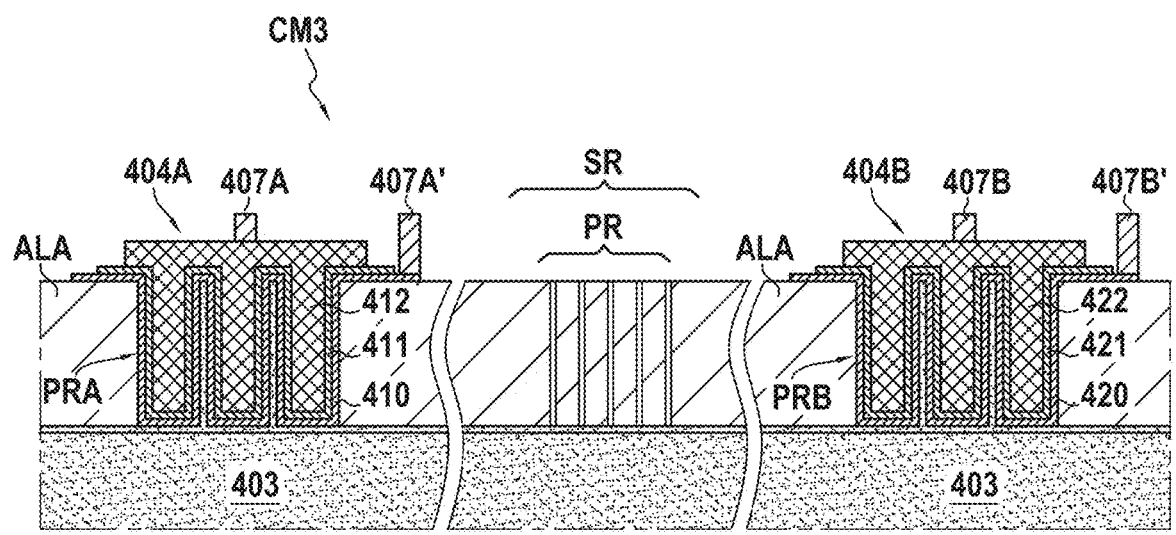
FIG. 4 is an example of a capacitor module wherein porous regions are used.

FIG. 4 shows another example of two 3D capacitors formed in a capacitor module CM3 which could be used as the capacitor module CM1 in the exemplary embodiment of FIGS. 2A to 2C.

The capacitor module CM3 comprises a base 403 which may include a semiconductor material. For example, the base may include active components formed in silicon and may be a full integrated circuit, or a silicon substrate without any components.

Two porous regions PRA and PRB have been formed above the base 403 in an alumina layer ALA forming a support with the base 403. The two porous regions are porous anodic aluminum oxide (MO), or any other material having pores extending from a face.

In order to form a first 3D capacitor 404A, the porous region is filled with a first conductive layer 410, a dielectric layer 411, and a second conductive layer 412.

In order to form a second 3D capacitor 404B, the porous region is filled with a first conductive layer 420, a dielectric layer 421, and a second conductive layer 422.

The person skilled in the art will understand that the structures obtained are a MIM structures: Metal-Insulator-Metal structures. However, MIMIM structures may also be used in porous regions.

It should be noted that forming the two 3D capacitors 404A and 404B may be done using common manufacturing steps.

For example, forming the two porous regions PRA and PRB may be done simultaneously in a single step, depositing the conductive layers 410 and 420 may be done simultaneously in a single step, depositing the dielectric layers 411 and 421 may be done simultaneously in a single step, and depositing the conductive layers 412 and 422 may be done simultaneously in a single step.

For accessing the electrodes of the capacitors, terminals 407A, 407A', 407B, and 407B' are respectively formed so as to obtain connections with layers 412, 410, 422, and 420.

In the illustrated example, the porous region may have a depth of a few micrometers to several tens of micrometers.

It should be noted that in the illustrated example, the two 3D capacitors are insulated from each other by the alumina of the alumina layer ALA. The permittivity of alumina may not be suitable for some applications and may lead to unacceptable parasitic coupling between the two capacitors for some applications.

Between the two capacitors, in the separating region SR, an additional porous region PR comprising anodic pores has been formed, for example in a simultaneous manner with the formation of porous regions PRA and PRB.

A capacitor module equipped with the porous region PR can be used for different applications requiring either different values of parasitic coupling or different values of characteristic impedance. Depending on the requirements of the application, it is possible to fill any number of anodic pores so as to adapt the characteristic impedance. A single capacitor module can therefore be used for different applications.

Forming the porous region PR can be simultaneous with forming the two porous region PRA and PRB, for example, this can be done in a same anodization step.

Figure 5A:
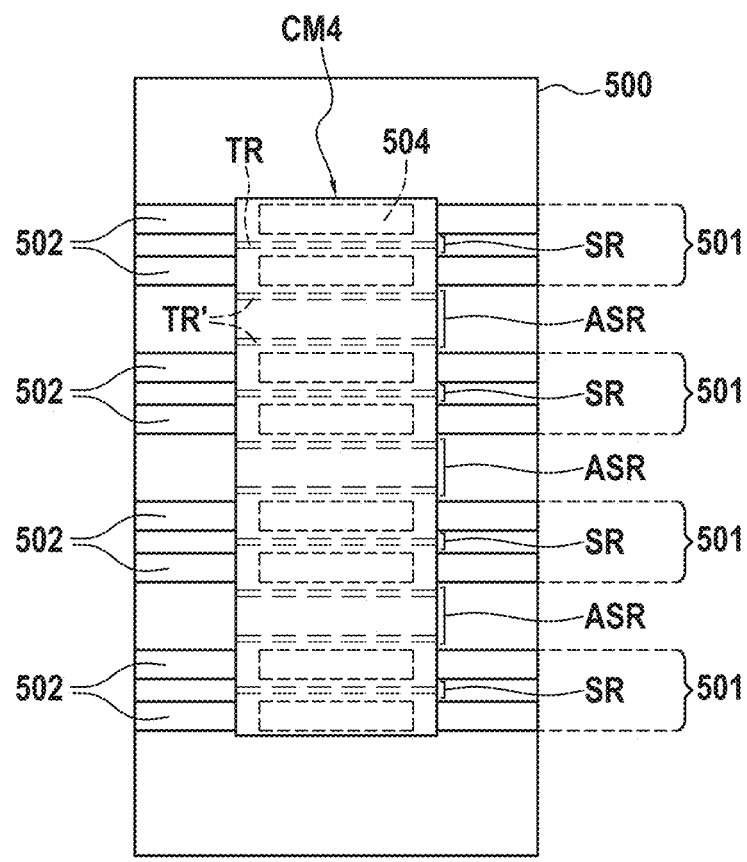
FIGS. 5A and 5B are examples wherein there are multiple pairs of differential transmission lines.

FIG. 5A is a top view of an electronic device comprising a board 500 supporting a plurality of pairs of differential transmission lines 501 (similar to the pairs 201 described in reference to FIGS. 2A and 2B) each comprising line segments 502.

The line segments are all straight in the portion of the device visible on the figure, with no shoulder introducing a length difference between two lines of a pair.

The electronic device further comprises a capacitor module CM4 comprising two capacitors 504 for each pair connected to the lines in a manner which is substantially the same as capacitors 204A and 204B of FIGS. 2A to 2C, with trenches TR arranged between the capacitors in the separating regions.

Two capacitors 504 of each pair of lines form a pair of capacitors and the support of the capacitor module CM4 comprises additional separating regions ASR comprising trenches TR', here two trenches between each pair of capacitors. It should be noted that the above embodiments concerning cavities formed in separating regions also apply to cavities formed in additional separating regions.

Figure 5B:
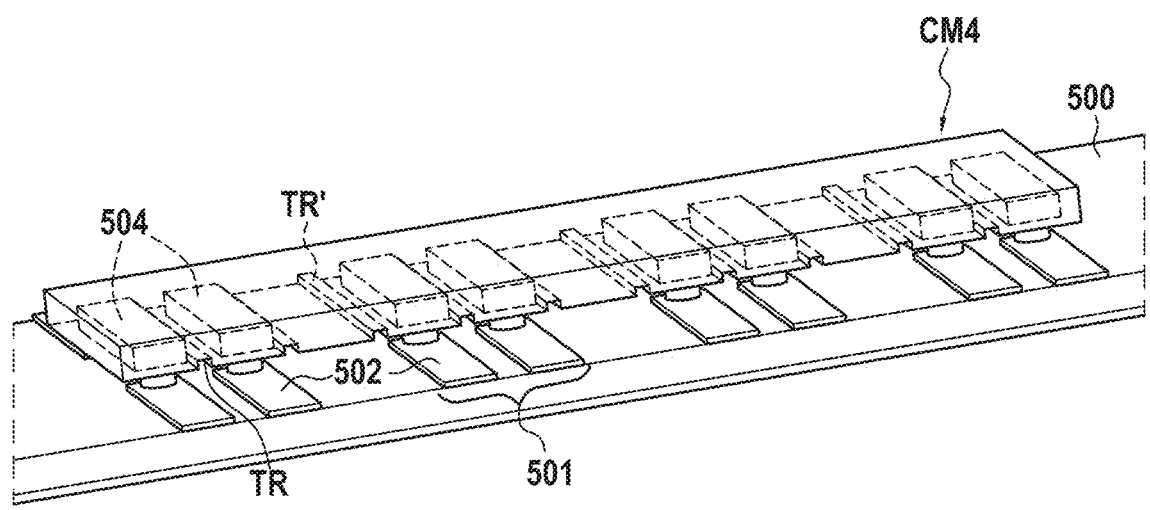

FIG. 5B is a perspective view of the device of FIG. 5A.

Figure 6:
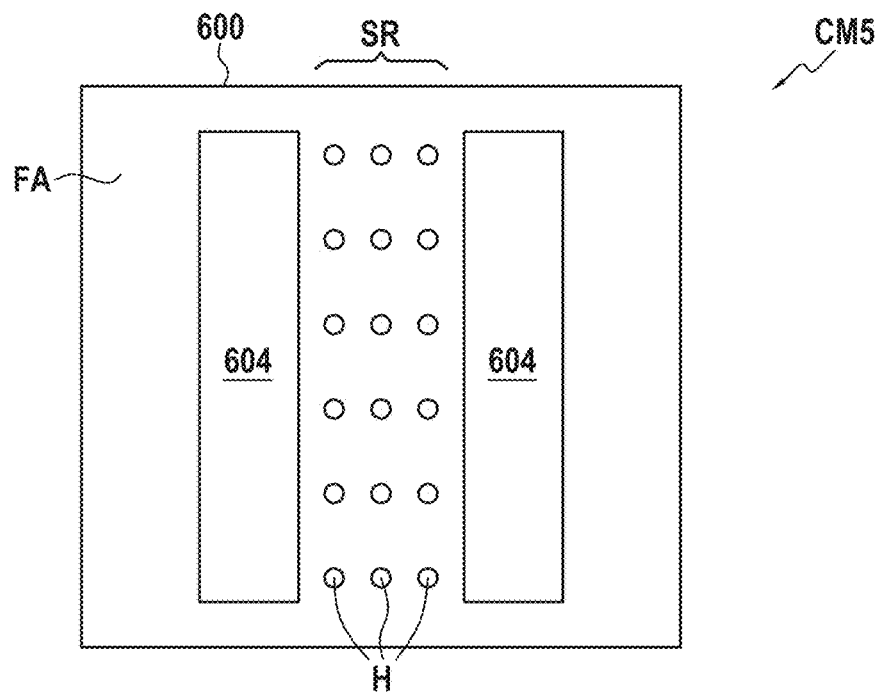
FIG. 6 is an example wherein holes are formed.

FIG. 6 is a schematic representation of a capacitor module CM5 comprising a support 600 and two capacitors 604 extending from a face FA of the support. Instead of the trenches described for example on FIGS. 2A to 2C, holes H are formed as cavities in order to modify locally the permittivity between the two capacitors. The holes H extend from face FA and are arranged in a regular pattern, along a grid. This facilitates filling a portion of the holes with a given material to precisely control the characteristic impedance of the capacitor module.

Figure 7:
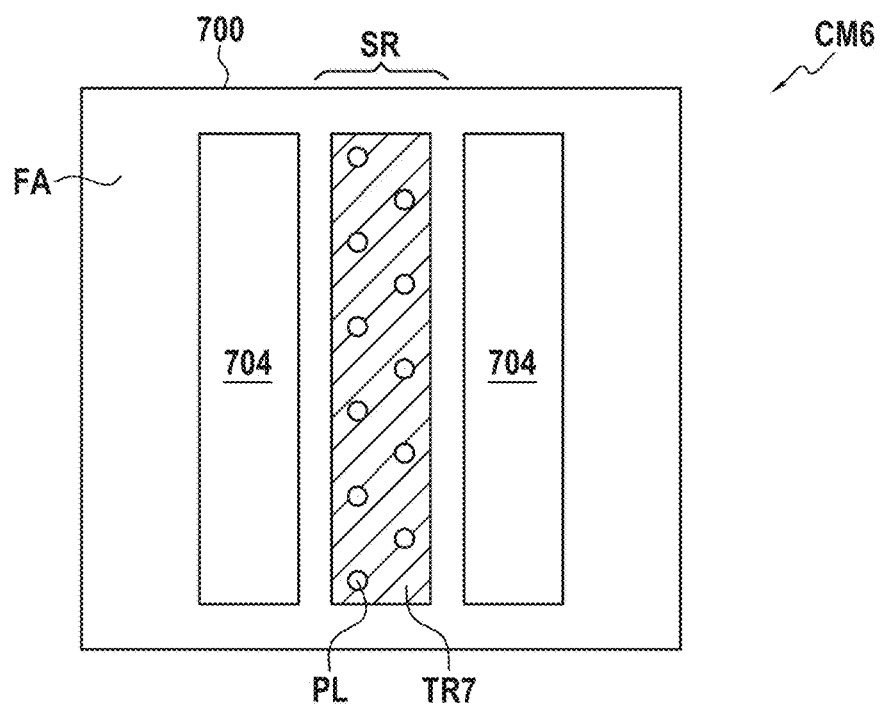
FIG. 7 is an example wherein a trench is formed around pillars.

FIG. 7 is a schematic representation of a capacitor module CM6 comprising a support 700 and two capacitors 704. Instead of the trenches described for example on FIGS. 2A to 2C, a trench TR7 is formed around a plurality of pillars PL which are aligned in a regular pattern.

Figure 8:
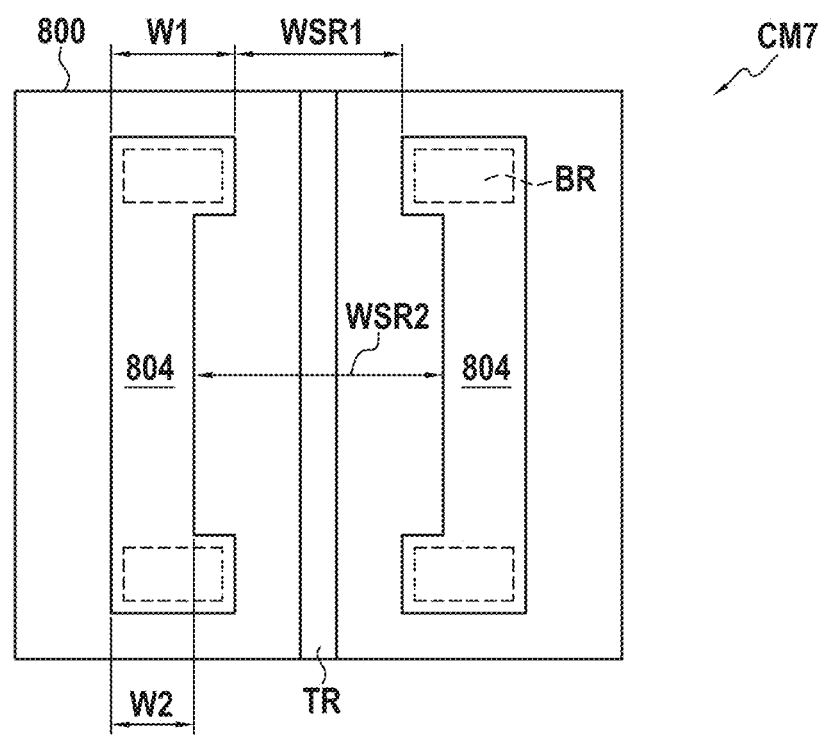
FIG. 8 is an example wherein the width of the intrinsic portion of the capacitors varies.

FIG. 8 is a schematic representation of a capacitor module CM7 comprising two capacitors 804. These two capacitors are separated by a trench TR which is analogous to the trench TR of FIGS. 2A to 2C.

The capacitors present a first width W1 at the level of the capacitor terminals and a second width W2 substantially between the two capacitor terminals of the capacitor, the second width being smaller than the first width. The capacitor terminals are located where conductive bumps will be formed in bump regions BR.

Consequentially, the width of the separating region varies along the direction defined by the direction in which the signal will travel through the capacitor module.

At the level of the capacitor terminals, the width WSR1 of the separating region is greater than the width WSR2 of the separating region between the capacitor terminals.

A reduction of the parasitic coupling is obtained when the width of the separating region is broader.

In the above example, the width W1 or W2 of the capacitor are measured by only taking into account the intrinsic portion of the capacitor. It is noted that other definitions of the width can be provided which could provide a same effect concerning the reduction of the parasitic coupling as long as they provide that there is a difference in the width of a conductive portion.

Although the present invention has been described above with reference to certain exemplary embodiments, it will be understood that the invention is not limited by the particularities of the specific embodiments.

The invention claimed is:

1. An electronic device comprising:
a board having a pair of differential transmission lines that each have an opening extending between two line terminals;
a capacitor module having a support and two capacitors that each have two capacitor terminals, respectively, connected to the two line terminals of one line of the pair of transmission lines,
wherein the support comprises a separating region disposed between the two capacitors and that includes at least one cavity disposed between the two capacitors, and
wherein the at least one cavity is one of a trench, a hole, or an anodic pore.

2. The electronic device of claim 1, wherein the two capacitors extend into the support and the at least one cavity faces the two capacitors over the depth within which the two capacitors extend into the support.

3. The electronic device of claim 1, wherein the two capacitors are formed using at least one common manufacturing step.

4. The electronic device of claim 1, wherein the at least one cavity is empty.

5. The electronic device of claim 1, wherein the separating region comprises a plurality of cavities arranged between the two capacitors, and all of the cavities of the plurality of cavities are empty.

6. The electronic device of claim 1, wherein the at least one cavity is filled with a given material.

7. The electronic device of claim 6, wherein the separating region comprises at least another cavity that is not filled with the given material.

8. The electronic device of claim 4, wherein the separating region comprises a plurality of cavities arranged so as to form a regular pattern.

9. The electronic device of claim 1, wherein the two capacitors present a first width at a level of the capacitor terminals and a second width substantially between the two capacitor terminals of a capacitor, with the second width being smaller than the first width.

10. The electronic device of claim 1, wherein the separating region comprises one or more substantially parallel trenches that are substantially parallel with the direction which signals travel in the differential transmission lines.

11. The electronic device of claim 1, further comprising a plurality of pairs of said differential transmission lines.

12. The electronic device of claim 11, wherein the capacitor module comprises, for each pair of differential transmission lines, two of said capacitors forming pairs of capacitors.

13. The electronic device of claim 12, wherein the support comprises additional separating regions disposed between each pair of capacitors, and at least one additional separating region comprising at least one cavity.

14. A method of manufacturing an electronic device comprising:
obtaining a board equipped with a pair of differential transmission lines that each have an opening extending between two line terminals;
obtaining a capacitor module having a support and two capacitors that each have two capacitor terminals, respectively, connected to the two line terminals of one line of the pair of transmission lines, with the two capacitors being separated by a separating region of the support; and
forming at least one cavity in the separating region, the at least one cavity being one of a trench, a hole, or an anodic pore.

15. The method of claim 14, further comprising filling the at least one cavity with a given material.

16. The method of claim 15, comprising forming at least another cavity and maintaining the at least another cavity unfilled with the given material.

17. The method of claim 14, wherein forming the at least one cavity comprises forming one of a trench, a hole, or an anodic pore.

18. The method of claim 17, further comprising forming one or more trenches using a saw, the one or more trenches substantially parallel trenches that are substantially parallel with a direction in which signals travel in the differential transmission lines.

* * * * *